(12) United States Patent
Patel

(10) Patent No.: US 10,020,825 B1
(45) Date of Patent: Jul. 10, 2018

(54) METHOD AND APPARATUS FOR TURBO DECODER DYNAMIC ITERATION CONTROL

(71) Applicant: MBIT WIRELESS, INC., Newport Beach, VA (US)

(72) Inventor: Bhaskar Patel, San Clemente, CA (US)

(73) Assignee: MBIT WIRELESS, INC., Irvine, CA (US)

( * ) Notice: Subject to any disclaimer, the term of this patent is extended or adjusted under 35 U.S.C. 154(b) by 265 days.

(21) Appl. No.: 14/964,791

(22) Filed: Dec. 10, 2015

(51) Int. Cl.
*H03M 13/00* (2006.01)
*H03M 13/37* (2006.01)
*H03M 13/25* (2006.01)

(52) U.S. Cl.
CPC ..... *H03M 13/3753* (2013.01); *H03M 13/258* (2013.01); *H03M 13/3707* (2013.01)

(58) Field of Classification Search
CPC .......... H03M 13/1105; H03M 13/1111; H03M 13/1128; H03M 13/2906; H03M 13/2975; H03M 13/3753
See application file for complete search history.

(56) References Cited

U.S. PATENT DOCUMENTS

| | | | |
|---|---|---|---|
| 2004/0140915 A1* | 7/2004 | Shen | H03M 13/1105 341/50 |
| 2004/0148556 A1* | 7/2004 | Hagh | H03M 13/2957 714/755 |
| 2009/0217123 A1* | 8/2009 | Dore | H03M 13/1105 714/752 |

OTHER PUBLICATIONS

Salmela et al. "On Allocation of Turbo Decoder Iterations," IEEE, pp. 157-160, 2003.*

* cited by examiner

*Primary Examiner* — Guy Lamarre
(74) *Attorney, Agent, or Firm* — Lerner, David, Littenberg, Krumholz & Mentlik, LLP

(57) ABSTRACT

Turbo codes are used for high throughput and high performance communication systems. Turbo codes are a class of codes that can be decoded iteratively for high performance. The iterative decoding leads to increased processing requirements which in turn requires a higher clock speed. A turbo decoder that can support the worst case clock speed requirement may lead to high power consumption. A method and apparatus are disclosed that enable high performance turbo decoding while keeping the required clock speed and the power consumption low.

20 Claims, 8 Drawing Sheets

FIG. 4

| CB # | X | Y | Z | C | W | B | R | N | A |
|---|---|---|---|---|---|---|---|---|---|
| 0 | 132 | 16 | 1 | 13 | 132 | 13 | 120 | 16 | 15 |
| 1 | 132 | 16 | 1 | 13 | 117 | 13 | 106 | 16 | 9 |
| 2 | 132 | 16 | 1 | 13 | 108 | 12 | 98 | 16 | 14 |
| 3 | 132 | 16 | 1 | 13 | 94 | 11 | 85 | 16 | 16 |
| 4 | 132 | 16 | 1 | 13 | 78 | 10 | 70 | 16 | 10 |
| 5 | 132 | 16 | 1 | 13 | 68 | 9 | 61 | 16 | 16 |
| 6 | 132 | 16 | 1 | 13 | 52 | 8 | 46 | 16 | 16 |
| 7 | 132 | 16 | 1 | 13 | 36 | 7 | 31 | 16 | 15 |
| 8 | 132 | 16 | 1 | 13 | 21 | 6 | 17 | 16 | 12 |
| 9 | 132 | 16 | 1 | 13 | 9 | 5 | 6 | 6 | 3 |
| 10 | 132 | 16 | 1 | 13 | 6 | 4 | 4 | 4 | 3 |
| 11 | 132 | 16 | 1 | 13 | 3 | 3 | 2 | 2 | 2 |
| 12 | 132 | 16 | 1 | 13 | 1 | 2 | 1 | 1 | 1 |
|  |  |  |  |  | 0 | 1 |  |  |  |

Initialization step (row CB# 0)

FIG. 5

| CB # | X | Y | Z | C | W | B | R | N | A |
|---|---|---|---|---|---|---|---|---|---|
| 0 | 132 | 16 | 1 | 13 | 132 | 13 | | 16 | |
| 0 | 132 | 16 | 1 | 13 | 125 | 13 | 120 | 16 | 7 |
| 1 | 132 | 16 | 1 | 13 | 117 | 12 | 114 | 16 | 8 |
| 2 | 132 | 16 | 1 | 13 | 106 | 11 | 107 | 16 | 11 |
| 3 | 132 | 16 | 1 | 13 | 93 | 10 | 97 | 16 | 13 |
| 4 | 132 | 16 | 1 | 13 | 77 | 9 | 85 | 16 | 16 |
| 5 | 132 | 16 | 1 | 13 | 66 | 8 | 70 | 16 | 11 |
| 6 | 132 | 16 | 1 | 13 | 61 | 7 | 60 | 16 | 5 |
| 7 | 132 | 16 | 1 | 13 | 53 | 6 | 56 | 16 | 8 |
| 8 | 132 | 16 | 1 | 13 | 47 | 5 | 49 | 16 | 6 |
| 9 | 132 | 16 | 1 | 13 | 42 | 4 | 44 | 16 | 5 |
| 10 | 132 | 16 | 1 | 13 | 31 | 3 | 40 | 16 | 11 |
| 11 | 132 | 16 | 1 | 13 | 16 | 2 | 30 | 16 | 15 |
| 12 | 132 | 16 | 1 | 13 | 10 | 1 | 16 | 16 | 6 |

← Initialization step

METHOD AND APPARATUS FOR TURBO DECODER DYNAMIC ITERATION CONTROL

BACKGROUND

Typically, as shown in FIG. 1, a wireless communication system 10 comprises elements such as client terminal or mobile station 12 and base stations 14. Other network devices which may be employed, such as a mobile switching center, are not shown. In some wireless communication systems there may be only one base station and many client terminals while in some other communication systems such as cellular wireless communication systems there are multiple base stations and a large number of client terminals communicating with each base station.

As illustrated, the communication path from the base station (BS) to the client terminal direction is referred to herein as the downlink (DL) and the communication path from the client terminal to the base station direction is referred to herein as the uplink (UL). In some wireless communication systems the client terminal or mobile station (MS) communicates with the BS in both DL and UL directions. For instance, this is the case in cellular telephone systems. In other wireless communication systems the client terminal communicates with the base stations in only one direction, usually the DL. This may occur in applications such as paging.

The base station with which the client terminal is communicating with is referred as the serving base station. In some wireless communication systems the serving base station is normally referred to as the serving cell. While in practice a cell may include one or more base stations, distinction is not made between a base station and a cell, and such terms may be used interchangeably herein. The base stations that are in the vicinity of the serving base station are called neighbor cell base stations. Similarly, in some wireless communication systems a neighbor base station is normally referred to as a neighbor cell.

High data rate wireless communication systems are deployed to address the growing demand for fast and mobile internet access. The Forward Error Correction (FEC) based on Turbo codes is one of the key factors in delivering highly efficient wireless communication systems that provide high data rate with limited Signal-to-Noise Ratio (SNR) and bandwidth. Turbo codes enable improved performance through iterative decoding process. The number of iterations required to successfully decode a block of data depends on many factors including the signal conditions (e.g., SNR), the code rate of FEC, etc.

The number of decoding iterations required in a Turbo decoder may be generally higher under poor signal conditions or at very high FEC code rates with limited redundant bits for error correction. To meet specified data rate requirements, a Turbo decoder may need to be designed for the highest throughput even under signal conditions and FEC code rates that require high number of iterations. This may require a Turbo decoder to run at a sufficiently high clock rate to complete all the iterations in the specified amount of time. For example, in $3^{rd}$ Generation Partnership Project (3GPP) Long Term Evolution (LTE) wireless communication system, 150752 payload bits may be transmitted by a base station for every subframe (1 ms) to a Category-4 client terminal. This corresponds to about 150 Mbps data throughput. These bits may be transmitted in smaller independently decodable blocks called Code Blocks (CB) within a single subframe. In case of 3GPP LTE wireless communication system, the maximum Code Block size is 6144 bits as specified in 3GPP "TS 36.212: Evolved Universal Terrestrial Radio Access (E-UTRA); Multiplexing and channel coding". Each Code Block may be individually encoded for FEC and Cyclic Redundancy Check (CRC). This means that about 150752/6144=25 Code Blocks of 6144 bits each need to be decoded in one subframe. As an example, if a Turbo decoder implementation supports a maximum of 16 iterations (8 normal order and 8 interleaved order iterations), the worst case number of iterations for all the Code Blocks may be 25 * 16=400. If a Turbo decoder requires one clock cycle for decoding one payload bit per iteration, the total maximum number of required clock cycles per subframe (1 ms) may be: 16 * 25 * 6144=2457600. This means that the turbo decoder may need to run at clock speed of about 2.5 GHz to be able handle worst case number of iterations. The actual clock speed requirement may be higher because it may not be possible to schedule the Turbo decoder for 100% utilization.

One of the methods for reducing the clock speed requirement for a Turbo decoder may be the use of higher radix Turbo decoder which can process more than one payload bit per clock cycle. For example, a radix-4 Turbo decoder may process two bits of payload data per clock cycle. Another method for reducing the clock speed requirement may be the use of multiple instances of a Turbo decoder working on a same Code Block data. For example, if there are four instances of a Turbo decoder, the required number of cycles may be proportionally reduced. Small initial overhead of setting up the Turbo decoder may remain about the same. Both of the methods above may reduce the clock speed requirement but lead to increased complexity which may in turn lead to increased power consumption.

For the example case of four instances of a radix-4 Turbo decoder, eight payload bits may be processed in one clock cycle. This may bring the clock frequency requirement of a Turbo decoder to under 300 MHz. However, this clock speed may be still too high, which may cause increased power consumption. Furthermore, the need for supporting worst case number of iterations may be rare. Therefore, the designed capacity of a Turbo decoder may be rarely used and yet it may contribute to increased power consumption.

Most Turbo decoders employ one or more of adaptive stopping criteria to stop performing further decoding iterations. One such criteria may be to check the CRC of a Code Block at the end of each iteration. If the CRC passes, then the Turbo decoder may stop performing further iterations on that Code Block. Another adaptive stopping criteria may include the detection of conditions where a Code Block may be unlikely to be successfully decoded regardless of the number of iterations. Despite using such adaptive stopping criteria, the worst case scenario of requiring maximum number of iterations in a subframe cannot be avoided.

Due to statistical nature of the signal conditions and the number of decoding iterations required, a Turbo decoder may require variable number of iterations and therefore variable amount of time to finish decoding all the Code Blocks of a subframe. If the decoding of one subframe is not finished before another subframe needs to be decoded, the processing of subsequent subframes may be delayed. Such consecutive delays can eventually cause excessive delays and the Turbo decoder may never catch up to the real time and be able to sustain the required throughput and latency requirements. Delay is a critical factor because the acknowledgement (positive or negative) may need to be sent to the base station in a timely manner for the Hybrid Automatic Repeat Request (HARQ) protocol to work properly. Therefore, even though on average the required number of Turbo decoder iterations may be low, a Turbo decoder must be designed to handle worst case scenarios over a sustained period of time.

Conventional methods for handling the Turbo decoder iterations requirement set an upper limit to the maximum number of Turbo iterations allowed for decoding one Code Block. Similarly, the maximum number of Turbo iterations allowed for an entire subframe may be limited to a value based on the implementation constraints. With the conventional method, if the turbo decoder completes the decoding of a Code Block in fewer iterations than the configured maximum allowed number of iterations, the time saved in unused iterations may not be utilized due to the static nature of the method.

SUMMARY

A method and apparatus are disclosed that dynamically control the number of iterations used by a Turbo decoder to decode a Code Block while maintaining high decoding performance and lower power consumption without exceeding the allowed number of maximum iterations per subframe.

In accordance with an aspect of the present invention, a method for controlling decoding in a communication system may include: controlling, by a processing device, steps of: (a) determining a minimum number of iterations required for decoding remaining undecoded Code Blocks of a current subframe of a communication signal other than the current Code Block MIN, in which the current subframe has a total number of Code Blocks C, where MIN=(B−1)*Z, where B is equal to a number of remaining Code Blocks to be decoded for the current subframe, and where Z is a minimum number of required iterations for a Code Block in the communication system; (b) determining a remaining number of iterations available for the current Code Block R, where R=W−MIN, and where W is equal to a remaining number of iterations for the current subframe; (c) setting a maximum number of iterations for decoding the current Code Block N equal to (i) a maximum number of iterations per Code Block Y, when R>Y and (ii) R, when R<Y; (d) beginning decoding of the current Code Block with a decoder configured according to N; and (e) after decoding of the current Code Block with the decoder is completed, updating W by subtracting, from a current value of W, an actual number of iterations performed by the decoder for the decoding of the current Code Block A, and updating B by subtracting one from a current value of B. In addition, the method may include controlling, by the processing device, the step of: (f) based on a value of B, performing the steps (a), (b), (c), (d) and (e) for each Code Block of the subframe not decoded by the decoder as the current Code Block.

In one alternative, W may be initialized to a maximum number of iterations per subframe X, which is according to at least one design parameter of the decoder and a predetermined clock frequency at which the decoder is to perform decoding.

In one alternative, the decoder may be a Turbo decoder.

In one alternative, Y may be selected according to simulations performed on the communication system under a plurality of signal to noise ratio (SNR) conditions and code rates.

In one alternative, B may be initialized to C, and C may be determined from allocation information received from a base station of the communication system.

In one alternative, the allocation information may be received at run time of decoding of the subframe by the decoder.

In one alternative, the setting of N for the current Code Block may include determining whether R>Y.

In one alternative, information about A may be received by the processing device from the decoder after decoding by the decoder of a given Code Block of the subframe is completed.

In one alternative, the step (f) may include the processing device determining whether B is greater than zero.

In one alternative, the communication system may be a wireless communication system and the signal may be received at a base station or a client terminal of the wireless communication system.

In one alternative, the wireless communication system may be a $3^{rd}$ Generation Partnership Project (3GPP) Long Term Evolution (LTE) wireless communication system.

In accordance with an aspect of the present invention, an apparatus for controlling decoding in a communication system may include circuitry configured to control operations of: (a) determining a minimum number of iterations required for decoding remaining undecoded Code Blocks of a current subframe of a communication signal other than the current Code Block MIN, in which the current subframe has a total number of Code Blocks C, where MIN=(B−1)*Z, where B is equal to a number of remaining Code Blocks to be decoded for the current subframe, and where Z is a minimum number of required iterations for a Code Block in the communication system; (b) determining a remaining number of iterations available for the current Code Block R, where R=W −MIN, and where W is equal to a remaining number of iterations for the current subframe; (c) setting a maximum number of iterations for decoding the current Code Block N equal to (i) a maximum number of iterations per Code Block Y, when R>Y and (ii) R, when R<Y; (d) beginning decoding of the current Code Block with a decoder configured according to N; (e) after decoding of the current Code Block with the decoder is completed, updating W by subtracting, from a current value of W, an actual number of iterations performed by the decoder for the decoding of the current Code Block A, and updating B by subtracting one from a current value of B; and (f) based on a value of B, performing the operations (a), (b), (c), (d) and (e) for each Code Block of the subframe not decoded by the decoder as the current Code Block.

In one alternative of the apparatus, W may be initialized to a maximum number of iterations per subframe X, which is according to at least one design parameter of the decoder and a predetermined clock frequency at which the decoder is to perform decoding.

In one alternative of the apparatus, Y may be selected according to simulations performed on the communication system under a plurality of signal to noise ratio (SNR) conditions and code rates.

In one alternative of the apparatus, the setting of N for the current Code Block may include determining whether R >Y.

In one alternative of the apparatus, information about A may be received by the processing device from the decoder after decoding by the decoder of a given Code Block of the subframe is completed.

In accordance with an aspect of the present invention, a wireless communication device may include a receiver to receive a communication signal in a communication system; and a processing device configured to control decoding of the communication signal. The processing device may be configured to control operations of: (a) determining a minimum number of iterations required for decoding remaining undecoded Code Blocks of a current subframe of the communication signal other than the current Code Block MIN, in which the current subframe has a total number of Code Blocks C, where MIN=(B−1)*Z, where B is equal to a number of remaining Code Blocks to be decoded for the current subframe, and where Z is a minimum number of required iterations for a Code Block in the communication system; (b)determining a remaining number of iterations available for the current Code Block R, where R=W−MIN, and where W is equal to a remaining number of iterations for the current subframe; (c) setting a maximum number of iterations for decoding the current Code Block N equal to (i) a maximum number of iterations per Code Block Y, when R>Y and (ii) R, when R<Y; (d) beginning decoding of the current Code Block with a decoder configured according to N; (e) after decoding of the current Code Block with the decoder is completed, updating W by subtracting, from a current value of W, an actual number of iterations performed by the decoder for the decoding of the current Code Block A, and updating B by subtracting one from a current value of B; and (f) based on a value of B, performing the operations (a), (b), (c), (d) and (e) for each Code Block of the subframe not decoded by the decoder as the current Code Block.

In one alternative of the device, W may be initialized to a maximum number of iterations per subframe X, which is according to at least one design parameter of the decoder and a predetermined clock frequency at which the decoder is to perform decoding.

In one alternative of the device, Y may be selected according to simulations performed on the communication system under a plurality of signal to noise ratio (SNR) conditions and code rates.

In one alternative of the device, the setting of N for the current Code Block may include determining whether R>Y.

BRIEF DESCRIPTION OF THE DRAWINGS

FIG. 4 illustrates an example Turbo decoder dynamic iteration control for high iteration count scenario according to the aspects of the present invention.

FIG. 5 illustrates an example Turbo decoder dynamic iteration control for low iteration count scenario according to the aspects of the present invention.

DETAILED DESCRIPTION

Figure 1:
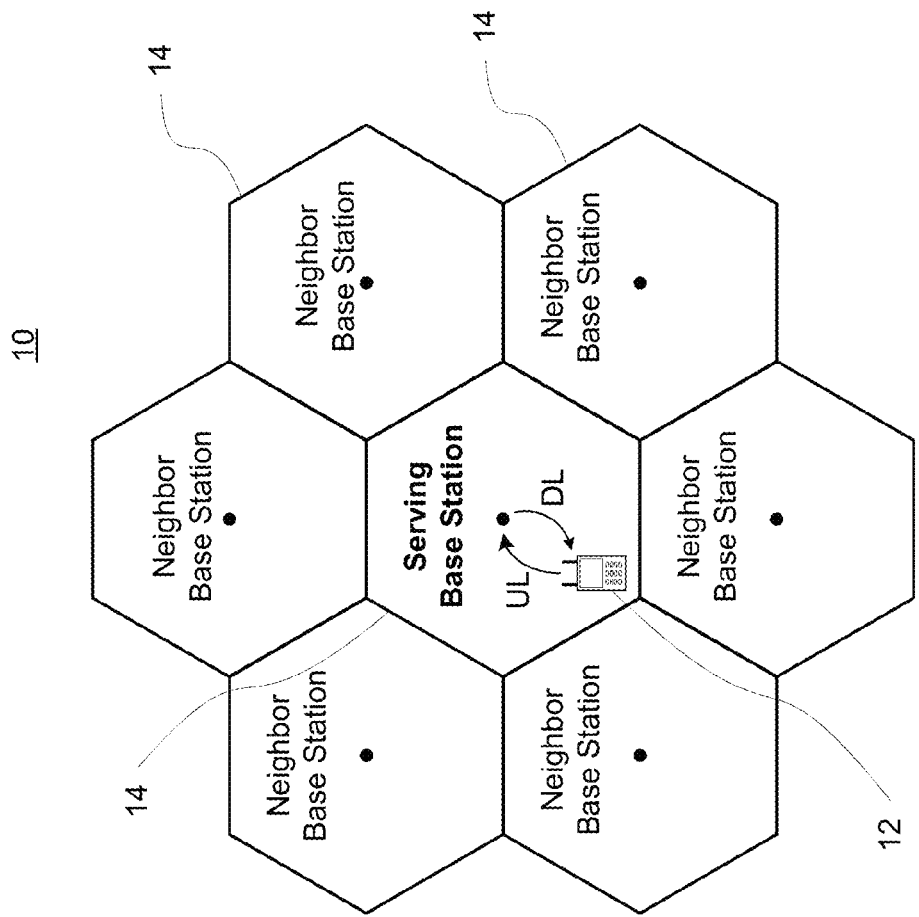
FIG. 1 illustrates a conventional wireless cellular communication system.

The foregoing aspects, features and advantages of the present invention will be further appreciated when considered with reference to the following description of exemplary embodiments and accompanying drawings, wherein like reference numerals represent like elements. In describing the exemplary embodiments of the invention illustrated in the appended drawings, specific terminology will be used for the sake of clarity. However, the invention is not intended to be limited to the specific terms used.

Depending on the prevailing SNR and code rate, the number of iterations required by a Turbo decoder may vary. Accurately determining the number of required iterations for a Turbo decoder may be difficult. Hence, the maximum number of iterations required by a Turbo decoder may not be fixed as a function of SNR or code rate. However, the average number of iterations required by a Turbo decoder may be determined based on system simulations under varying SNR conditions and code rates.

Figure 2:
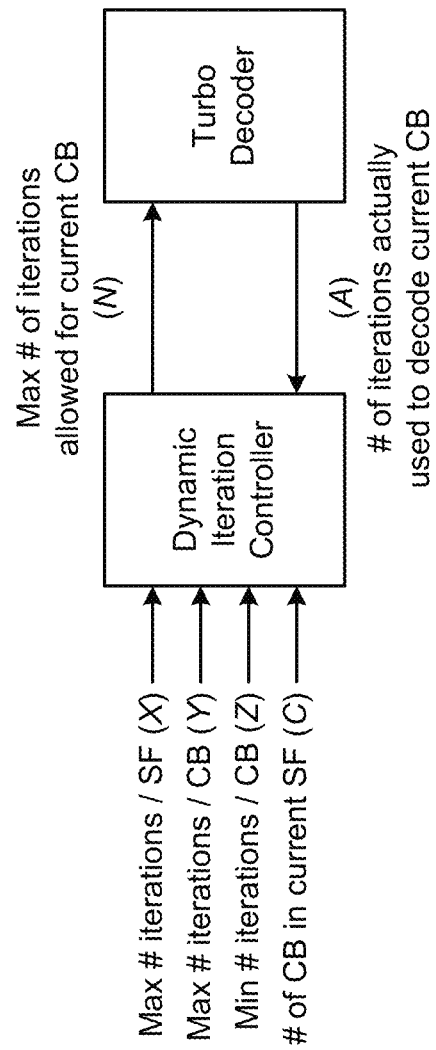
FIG. 2 illustrates the block diagram for the interface between the Dynamic Integration Controller and Turbo decoder according to the aspects of the present invention.

According to the aspects of the present invention a Dynamic Iteration Controller is used to dynamically configure the maximum number of iterations allowed on a per Code Block basis as shown in FIG. 2. According to the aspects of the present invention, the following parameters are input to the Dynamic Iteration Controller:

The maximum number of iterations per subframe (SF) denoted by X. This information may be determined from the design of the Turbo decoder and the planned clock frequency at which the decoder may be running.

The maximum number of iterations per Code Block denoted by Y. This information may be determined from the system simulations under varying SNR conditions and code rates.

The minimum number of required iterations for a Code Block, denoted by Z.

The number of Code Blocks to be decoded in a given subframe denoted by C. This information may be determined from the allocation information received from the base station for each subframe.

The parameters X, Y and Z may be determined off-line at design time whereas the parameter C may be known dynamically at run time based on the allocation information from the base station.

According to the aspects of the present invention, the Dynamic Iteration Controller determines the parameter N which is the maximum number of iterations allowed for decoding the current Code Block. According to another aspect of the present invention, the Dynamic Iteration Controller may configure the parameter N to the Turbo decoder before triggering the decoding of each Code Block. According to another aspect of the invention, at the completion of the decoding of a Code Block, Dynamic Iteration controller receives the value of parameter A which is the actual number of iterations used by the Turbo decoder for decoding the current Code Block as shown in FIG. 2.

According to an aspect of the present invention, the parameter N may be determined by the Dynamic Iteration Controller as follows. According to the aspects of the present invention, the following parameters are maintained internally by the Dynamic Iteration Controller to determine the value of the parameter N:
- The number of Code Blocks remaining to be decoded at any given instance, denoted by B.
- The number of remaining iterations for the current subframe, denoted by W.

Figure 3:
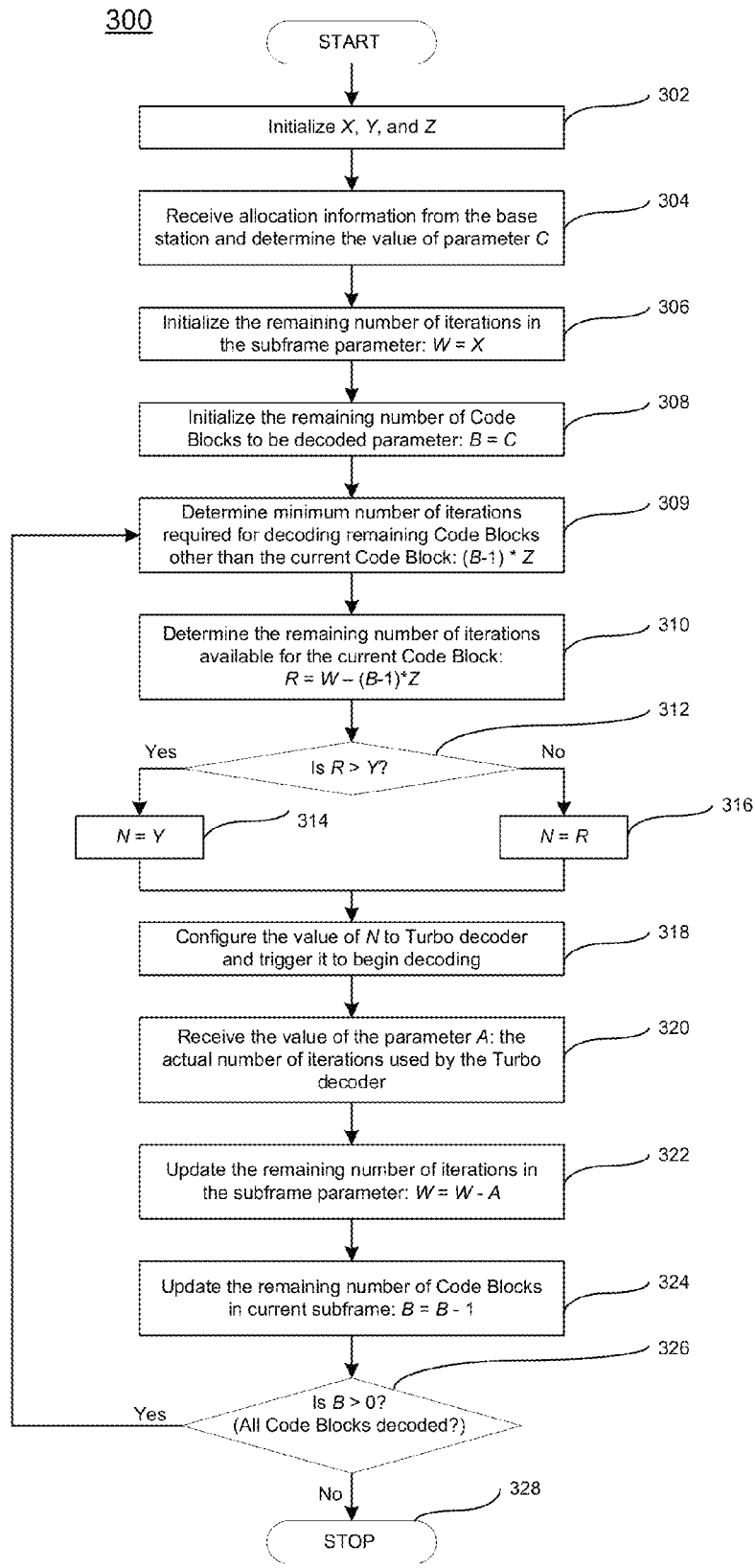
FIG. 3 illustrates the flow diagram for the processing steps according to aspects of the present invention.

The flow diagram 300 contained in FIG. 3 illustrates the method according to aspects of the present invention. The processing relevant to the present invention begins at the processing stage 302 where the initialization of the parameters X, Y, and Z is performed. At processing stage 304, the client terminal may receive the allocation information from a base station and from that it may determine the number of Code Blocks C in the current allocation. At processing stage 306, the number of remaining iterations for the current subframe, i.e., the parameter W, is initialized to the value of the parameter X. At processing stage 308, the number of remaining Code Blocks to be decoded for the current subframe, i.e., the parameter B, is initialized to the value of the parameter C. At processing stage 309, the minimum number of iterations required for decoding the remaining Code Blocks other than the current Code Block is determined as (B−1)*Z. At processing stage 310, the remaining number of iterations available for the current Code Block is determined as R=W−(B−1)*Z. If the remaining number of iterations available for the current Code Block, i.e., R, is greater than the maximum number of iterations per Code Block, i.e., Y, then the number of iterations for the current Code Block is set to Y, i.e., N=Y at processing stage 314. If the remaining number of iterations available for the current Code Block, i.e., R, is less than or equal to the maximum number of iterations per Code Block, i.e., Y, then the number of iterations for the current Code Block is set to R, i.e., N=R at processing stage 316. Regardless of the value determined for N, the processing continues at processing stage 318 where the determined value of N is configured to the Turbo decoder and it is triggered to begin the decoding of the Code Block. After the Turbo decoding is completed, at the processing stage 320, the Dynamic Iteration Controller receives the information about actual number of iterations used for the current Code Block, i.e., A from the Turbo decoder. At processing stage 322, the number of remaining iterations for the current subframe, i.e., the parameter W, is updated by subtracting the A iterations consumed for decoding the current Code Block. At processing stage 324, the number of remaining Code Blocks for the current subframe, i.e., the parameter B, is decremented by one for completing the decoding of the current Code Block. At processing stage 326, determination is made whether all the Code Blocks have been decoded or not based on the value of the parameter B. If not all the Code Blocks have been decoded, the processing returns to the processing stage 309. If all the Code Blocks have been decoded, the processing for the current subframe terminates at stage 328.

An example execution of the present invention is illustrated in the table contained in FIG. 4. The parameters X, Y, and Z are initialized with the values according to the design of the Turbo decoder and the off-line system level simulations. The value of the parameter C is obtained from the base station for a given subframe. With this initialization, the rest of the parameters are computed as shown in the table contained in FIG. 4 for each of the Code Block being processed. In the present example, the actual number of iterations used by the Turbo decoder is higher than the typical number of iterations required. Therefore, as the processing proceeds towards the last few Code Blocks, the number of remaining iterations in the subframe, i.e., W, may be low and therefore the maximum number of allowed iterations, i.e., N, is reduced for these Code Blocks. The present invention enables the decoding completion of all the Code Blocks in a timely manner and processes all the Code Blocks in a subframe regardless.

Another example execution of the present invention is illustrated in the table contained in FIG. 5. The parameters X, Y, and Z are initialized with the values according to the design of the Turbo decoder and the off-line system level simulations. The value of the parameter C is obtained from the base station for a given subframe. With this initialization, the rest of the parameters are computed as shown in the table contained in FIG. 5 for each of the Code Block being processed. In the present example, the actual number of iterations used by the Turbo decoder is lower than the typical number of iterations required. Therefore, as the processing proceeds towards the last few Code Blocks, the number of remaining iterations in the subframe, i.e., W, may be high and therefore the maximum number of allowed iterations, i.e., N, remains the same for all the Code Blocks. The aspects of the present invention enable the decoding completion of all the Code Blocks in a timely manner and processes all the Code Blocks in a subframe regardless with the optimum number of available iterations.

The disclosed method enables the decoding of the Turbo codes in wide ranging signal conditions and enables a predictable decoding schedule with predictable timing of decoding events. This may also enable the reduction of the clock frequency for which the Turbo decoder may need to be designed and operated while maintaining the required decoding throughput. The aspects of the present invention also enable predictable decoding schedule with predictable timing of decoding events for all the subframes which is essential for stable and reliable operation in real time systems. By way of example only, the above-described method may be implemented in a receiver, e.g., a user device such as a wireless mobile station (MS) 12 as shown in FIG. 1.

Figure 6:
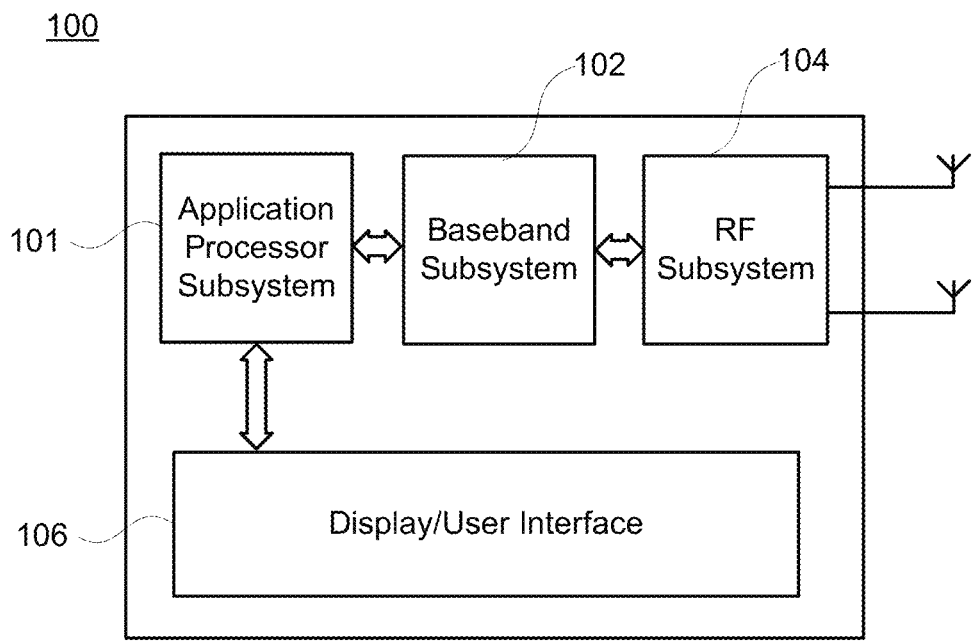
FIG. 6 illustrates a wireless mobile station diagram, which may be employed with aspects of the invention described herein.

As shown in FIG. 6, MS 100 may include an application processor subsystem 101, baseband subsystem 102 and a radio frequency (RF) subsystem 104 for use with a wireless communication network. A display/user interface 106 provides information to and receives input from the user. By way of example, the user interface may include one or more actuators, a speaker and a microphone. In some mobile devices, certain combination of the application processor subsystem 101, the baseband subsystem 102 and the RF subsystem 104 are all integrated as one integrated chip.

Figure 7:
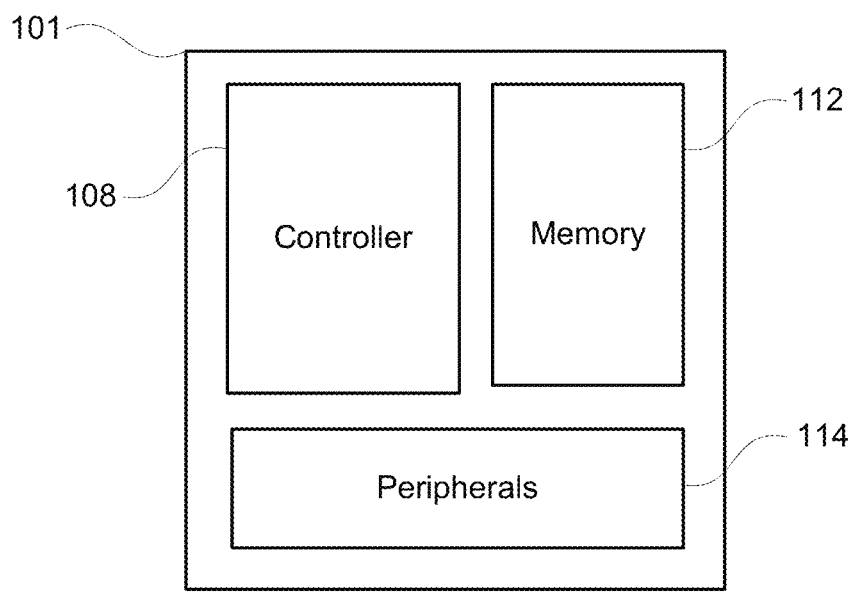
FIG. 7 illustrates an application processor subsystem for a wireless mobile station, which may be employed with aspects of the invention described herein.
Figure 8:
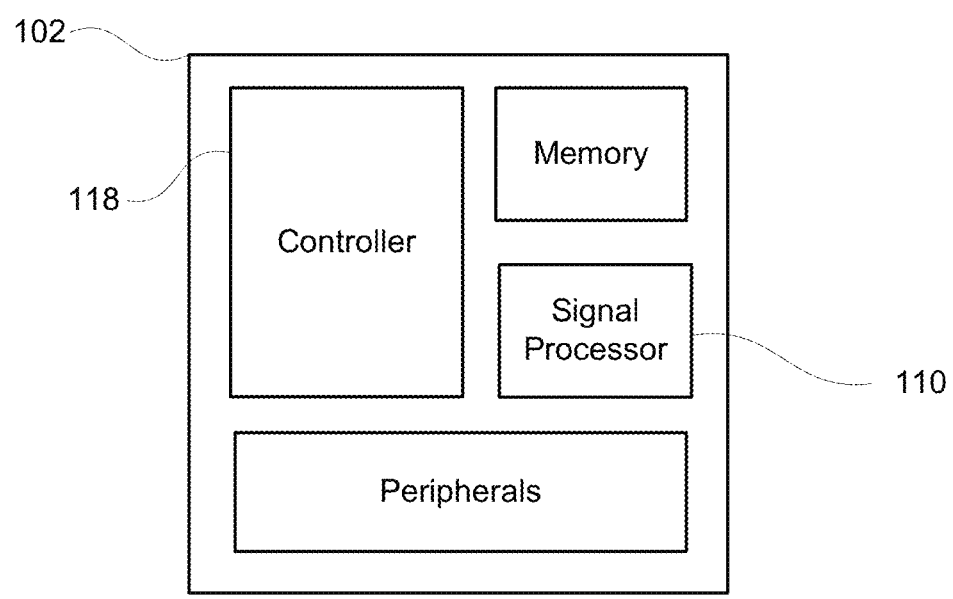
FIG. 8 illustrates a baseband subsystem for a wireless mobile station, which may be employed with aspects of the invention described herein.
Figure 9:
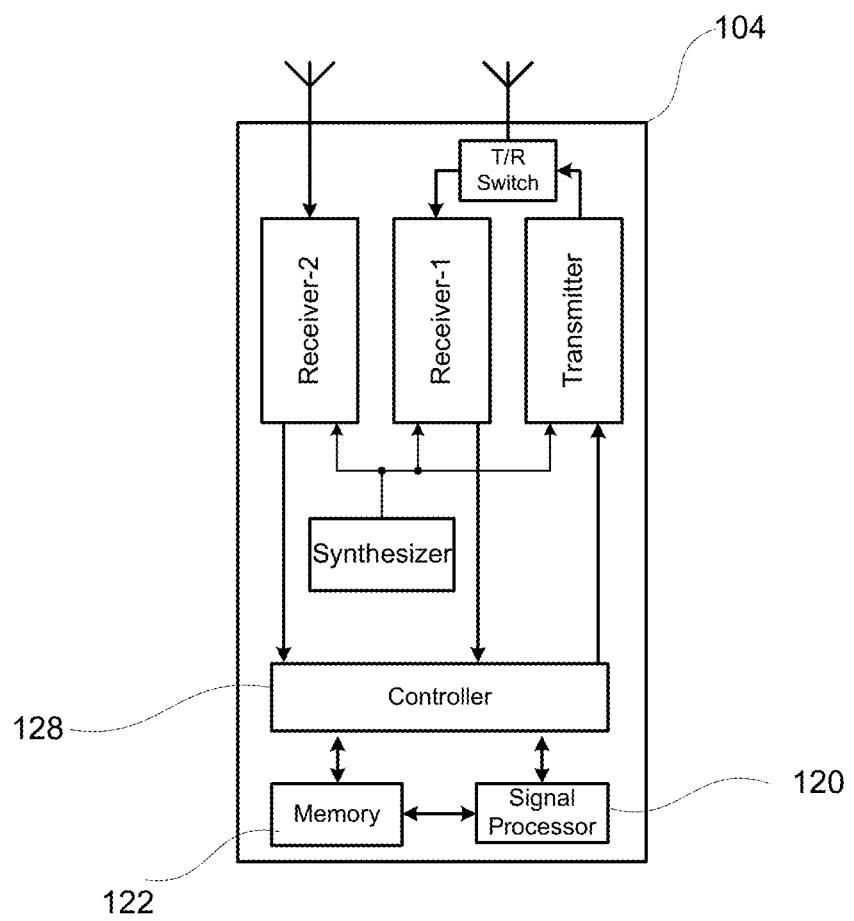
FIG. 9 illustrates an RF subsystem for a wireless mobile station, which may be employed with aspects of the invention described herein.

The application processor subsystem 101 as shown in FIG. 7 may include a controller 108 such as a microcontroller another processor or other circuitry. The baseband subsystem 102 as shown in FIG. 8 may include a controller 118 such as a microcontroller or other processor. The RF subsystem 104 as shown in FIG. 9 may include a controller 128 such as a microcontroller, another processor or other circuitry. The controller 108 desirably handles overall operation of the MS 100. This may be done by any combination of hardware, software and firmware running on the controller 108. Such a combination of hardware, software and firmware may embody any methods in accordance with aspects of the present invention.

Peripherals 114 such as a full or partial keyboard, video or still image display, audio interface, etc may be employed and managed through the controller 108.

Aspects of the present invention may be implemented in firmware of the controller 108 of the application processor and/or the controller 118 of the baseband subsystem. In another alternative, aspects of the present invention may also be implemented as a combination of firmware and hardware of the application processor subsystem 101 and/or the baseband subsystem 102. For instance, a signal processing entity of any or all of the FIG. 8 may be implemented in firmware, hardware and/or software. It may be part of the baseband subsystem, the receiver subsystem or be associated with both subsystems. In one example, the controller 118 and/or the signal processor 110 may include or control the protocol entity circuitry. The software may reside in internal or external memory and any data may be stored in such memory. The hardware may be an application specific integrated circuit (ASIC), field programmable gate array (FPGA), discrete logic components or any combination of such devices. The terms controller and processor are used interchangeably herein.

The consumer electronics devices that may use the aspects of the invention may include smartphones, tablets, laptops, gaming consoles, cameras, video camcorders, TV, car entertainment systems, etc.

Although the aspects of the present invention have been illustrated for a client terminal of a 3GPP LTE wireless communication system, they are applicable to a base station of a 3GPP LTE wireless communication system. In general, the aspects of the present invention are applicable to any system or device where iterative Turbo decoding is used.

Although aspects of the invention herein have been described with reference to particular embodiments, it is to be understood that these embodiments are merely illustrative of the principles and applications of the aspects of the present invention. It is therefore to be understood that numerous modifications may be made to the illustrative embodiments and that other arrangements may be devised without departing from the spirit and scope of the aspects of the present invention as defined by the appended claims. Aspects of each embodiment may be employed in the other embodiments described herein.

The invention claimed is:

1. A method for controlling decoding in a communication system, the method comprising:
   controlling, by a processing device, steps of:
   (a) determining a minimum number of iterations required for decoding remaining undecoded Code Blocks of a current subframe of a communication signal other than the current Code Block MIN, in which the current subframe has a total number of Code Blocks C,
   where MIN=(B−1)*Z,
   where B is equal to a number of remaining Code Blocks to be decoded for the current subframe, and
   where Z is a minimum number of required iterations for a Code Block in the communication system;
   (b) determining a remaining number of iterations available for the current Code Block R,
   where R=W−MIN, and
   where W is equal to a remaining number of iterations for the current subframe;
   (c) setting a maximum number of iterations for decoding the current Code Block N equal to (i) a maximum number of iterations per Code Block Y, when R>Y and (ii) R, when R≤Y;
   (d) beginning decoding of the current Code Block with a decoder configured according to N;
   (e) after decoding of the current Code Block with the decoder is completed,
   updating W by subtracting, from a current value of W, an actual number of iterations performed by the decoder for the decoding of the current Code Block A, and
   updating B by subtracting one from a current value of B; and
   (f) based on a value of B, performing the steps (a), (b), (c), (d) and (e) for each Code Block of the subframe not decoded by the decoder as the current Code Block,
   wherein the method further comprises, controlling, by the processing device, for a given current Code Block, a clock frequency for the decoder to perform decoding of the given current Code Block, according to W, a maximum number of iterations per subframe X and B.

2. The method of claim 1, wherein W is initialized to X, which is according to at least one design parameter of the decoder and a predetermined clock frequency at which the decoder is to perform decoding.

3. The method of claim 2, wherein the decoder is a Turbo decoder.

4. The method of claim 1, wherein Y is selected according to simulations performed on the communication system under a plurality of signal to noise ratio (SNR) conditions and code rates.

5. The method of claim 1, wherein B is initialized to C, and wherein C is determined from allocation information received from a base station of the communication system.

6. The method of claim 5, wherein the allocation information is received at run time of decoding of the subframe by the decoder.

7. The method of claim 1, wherein the setting of N for the current Code Block includes determining whether R>Y.

8. The method of claim 1, wherein information about A is received by the processing device from the decoder after decoding by the decoder of the given current Code Block of the subframe is completed.

9. The method of claim 1, wherein the step (f) includes the processing device determining whether B is greater than zero.

10. The method of claim 1, wherein the communication system is a wireless communication system and the signal is received at a base station or a client terminal of the wireless communication system.

11. The method of claim 10, wherein the wireless communication system is a $3^{rd}$ Generation Partnership Project (3GPP) Long Term Evolution (LTE) wireless communication system.

12. An apparatus for controlling decoding in a communication system, the apparatus comprising:
   circuitry configured to control operations of:
   (a) determining a minimum number of iterations required for decoding remaining undecoded Code Blocks of a current subframe of a communication signal other than the current Code Block MIN, in which the current subframe has a total number of Code Blocks C,
   where MIN=(B−1)*Z,
   where B is equal to a number of remaining Code Blocks to be decoded for the current subframe, and
   where Z is a minimum number of required iterations for a Code Block in the communication system;
   (b) determining a remaining number of iterations available for the current Code Block R,
   where R=W−MIN, and
   where W is equal to a remaining number of iterations for the current subframe;
   (c) setting a maximum number of iterations for decoding the current Code Block N equal to (i) a maximum number of iterations per Code Block Y, when R>Y and (ii) R, when R≤Y;
   (d) beginning decoding of the current Code Block with a decoder configured according to N;
   (e) after decoding of the current Code Block with the decoder is completed,
   updating W by subtracting, from a current value of W, an actual number of iterations performed by the decoder for the decoding of the current Code Block A, and
   updating B by subtracting one from a current value of B; and
   (f) based on a value of B, performing the operations (a), (b), (c), (d) and (e) for each Code Block of the subframe not decoded by the decoder as the current Code Block, wherein the circuitry is configured to control, for a given current Code Block, a clock frequency for the decoder to perform decoding of the given current Code Block, according to W, a maximum number of iterations per subframe X and B.

13. The apparatus of claim 12, wherein W is initialized to X, which is according to at least one design parameter of the decoder and a predetermined clock frequency at which the decoder is to perform decoding.

14. The apparatus of claim 12, wherein Y is selected according to simulations performed on the communication system under a plurality of signal to noise ratio (SNR) conditions and code rates.

15. The apparatus of claim 12, wherein the setting of N for the current Code Block includes determining whether R>Y.

16. The apparatus of claim 12, wherein information about A is received by the processing device from the decoder after decoding by the decoder of the given current Code Block of the subframe is completed.

17. A wireless communication device comprising:
  a receiver to receive a communication signal in a communication system; and
  a processing device configured to control decoding of the communication signal,
  wherein the processing device is configured to control operations of:
  (a) determining a minimum number of iterations required for decoding remaining undecoded Code Blocks of a current subframe of the communication signal other than the current Code Block MIN, in which the current subframe has a total number of Code Blocks C,
  where MIN=(B−1)*Z,
  where B is equal to a number of remaining Code Blocks to be decoded for the current subframe, and
  where Z is a minimum number of required iterations for a Code Block in the communication system;
  (b) determining a remaining number of iterations available for the current Code Block R,
  where R=W−MIN, and
  where W is equal to a remaining number of iterations for the current subframe;
  (c) setting a maximum number of iterations for decoding the current Code Block N equal to (i) a maximum number of iterations per Code Block Y, when R>Y and (ii) R, when R≤Y;
  (d) beginning decoding of the current Code Block with a decoder configured according to N;
  (e) after decoding of the current Code Block with the decoder is completed,
  updating W by subtracting, from a current value of W, an actual number of iterations performed by the decoder for the decoding of the current Code Block A, and
  updating B by subtracting one from a current value of B; and
  (f) based on a value of B, performing the operations (a), (b), (c), (d) and (e) for each Code Block of the subframe not decoded by the decoder as the current Code Block,
  wherein the processing device is configured to control, for a given current Code Block, a clock frequency for the decoder to perform decoding of the given current Code Block, according to W, a maximum number of iterations per subframe X and B.

18. The device of claim 17, wherein W is initialized to X, which is according to at least one design parameter of the decoder and a predetermined clock frequency at which the decoder is to perform decoding.

19. The device of claim 17, wherein Y is selected according to simulations performed on the communication system under a plurality of signal to noise ratio (SNR) conditions and code rates.

20. The device of claim 17, wherein the setting of N for the current Code Block includes determining whether R>Y.

* * * * *